United States Patent [19]
Boerstler

[11] Patent Number: 5,870,003
[45] Date of Patent: Feb. 9, 1999

[54] HIGH FREQUENCY PHASE-LOCKED LOOP CIRCUIT HAVING REDUCED JITTER

[75] Inventor: David William Boerstler, Round Rock, Tex.

[73] Assignee: International Business Machines Corporation, Armonk, N.Y.

[21] Appl. No.: 943,425

[22] Filed: Oct. 3, 1997

[51] Int. Cl.$^6$ .............................. H03L 7/089; H03L 7/18
[52] U.S. Cl. .................................. 331/17; 331/8; 331/25; 331/34; 331/57; 327/157
[58] Field of Search .................................. 331/1 A, 8, 11, 331/17, 25, 34, 57; 327/156–159; 375/376; 455/260

[56] References Cited
U.S. PATENT DOCUMENTS 5,740,213   4/1998   Dreyer ..................................... 375/374

Primary Examiner—David Mis
Attorney, Agent, or Firm—Casimer K. Salys; Antony P. Ng; Andrew J. Dillon

[57] ABSTRACT

A phase-locked loop circuit for providing external clock signals to a processor is disclosed. The phase-locked loop circuit includes a phase/frequency detector, a voltage-control oscillator, and two charge pumps. The phase/frequency detector receives an input reference signal and provides a first differential output and a second differential output. The voltage-controlled oscillator has a feed-forward current input and is utilized to generate an output clock signal, wherein the output clock signal is also utilized as a feedback signal for the phase/frequency detector. The first charge-pump, coupled between the phase/frequency detector and the voltage-controlled oscillator, receives the first and second differential outputs from the phase/frequency detector and provides a differential voltage control signal for the voltage-controlled oscillator. The second charge pump is utilized to produce a stable system response by increasing the loop dumping.

12 Claims, 4 Drawing Sheets

HIGH FREQUENCY PHASE-LOCKED LOOP CIRCUIT HAVING REDUCED JITTER

CROSS REFERENCE TO RELATED APPLICATIONS

The present application is related to the following copending United States Patent Applications:

1. Ser. No. 08/673,542, now U.S. Pat. No. 5,757,240, entitled "Low Gain Voltage-Controller Oscillator," filed on Jul. 1, 1996 (IBM docket no. AT9-96-028);

2. Ser. No. 08/863,151, entitled "Voltage Controlled Current Source for Low Voltage Applications," filed on May 27, 1997(IBM docket no. AT9-97-106);

3. Ser. No. 08/863,152, entitled "Low Voltage Phase Mixing Apparatus," filed on May 27, 1997 (IBM docket no. AT9-97-105);

4. Ser. No. 08/888,797, entitled "Self-resetting Phase/Frequency Detector with Reduced Dead Zone," filed on Jul. 7, 1997 (IBM docket no. AT9-97-047);

5. Ser. No. 08/943,426, entitled "Differential Charge Pump and Filter with Common-mode Voltage Control," filed on even date (IBM docket no. AT9-97-706).

All above-mentioned copending applications are assigned to the assignee of the present application.

BACKGROUND OF THE INVENTION

1. Technical Field

The present invention relates to electronic circuits in general, and in particular to an electronic circuit for providing clock signals. Still more particularly, the present invention relates to a phase-locked loop circuit for providing external clock signals to a processor.

2. Description of the Prior Art

Electronic circuits for providing clock signals are utilized in a wide assortment of digital devices and components. For example, within a computer system, processor(s) and other components such as random access memories, utilize clock signals to synchronize various operations. As the operating frequency of processors becomes higher and higher, approaching 1 GHz and beyond, it becomes increasingly difficult to provide an external clock signal having the same frequency as the processor clock. The recent trend is to alleviate this problem by utilizing a phase-locked loop (PLL) circuit to supply an external clock signal.

In the prior art, a PLL circuit typically includes a phase/frequency detector, a low-pass filter, and a voltage-controlled oscillator (VCO). The phase/frequency detector compares two input signals, namely, a reference signal (from an external system clock) and a feedback signal, to generate a phase error signal that is a measure of their phase difference. The phase error signal from the phase/frequency detector is filtered by the low-pass filter and fed into the control input of the VCO. The VCO then generates a periodic signal with a frequency controlled by the filtered phase error signal. The VCO output is coupled to the feedback input of the phase/frequency detector, thereby forming a feedback loop. If the frequency of the feedback signal is not equal to the frequency of the reference signal, the filtered phase error signal causes the VCO frequency to shift toward the frequency of the reference signal, until the VCO finally locks onto the frequency of the reference signal. Phase acquisition follows in a similar manner. The output of the VCO is then utilized as a clock signal for a processor.

Although a PLL circuit allows an external clock source of a relatively low frequency to be utilized for clock signal synthesis, jitter is also added to the synthesized clock signals during the process. In fact, it is very difficult to control these high frequency PLL jitters due to the high intrinsic sensitivity of the VCO to process, environment, and noise, along with the proportionally smaller timing budget allowance. Consequently, it is desirable to provide an improved PLL design that reduces high frequency PLL jitter.

SUMMARY OF THE INVENTION

In view of the foregoing, it is therefore an object of the present invention to provide an improved electronic circuit.

It is another object of the present invention to provide an improved electronic circuit for supplying clock signals.

It is yet another object of the present invention to provide an improved phase-locked loop circuit for supplying external clock signals to a processor.

In accordance with a method and apparatus of the present invention, a phase-locked loop circuit includes a phase/frequency detector, a voltage-controlled oscillator, and a charge pump. The phase/frequency detector receives an input reference signal and provides a first differential output and a second differential output. The voltage-controlled oscillator has a feed-forward current input and is utilized to generate an output clock signal, wherein the output clock signal is also utilized as a feedback signal for the phase/frequency detector. The charge-pump, coupled between the phase/frequency detector and the voltage-controlled oscillator, receives the first and second differential outputs from the phase/frequency detector and provides a differential voltage control signal for the voltage-controlled oscillator.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The present invention may be applicable for providing an external clock signal to a processor. It is understood by those skilled in the art that the present invention may also be applicable for any devices or components that require a clock input.

Figure 1:
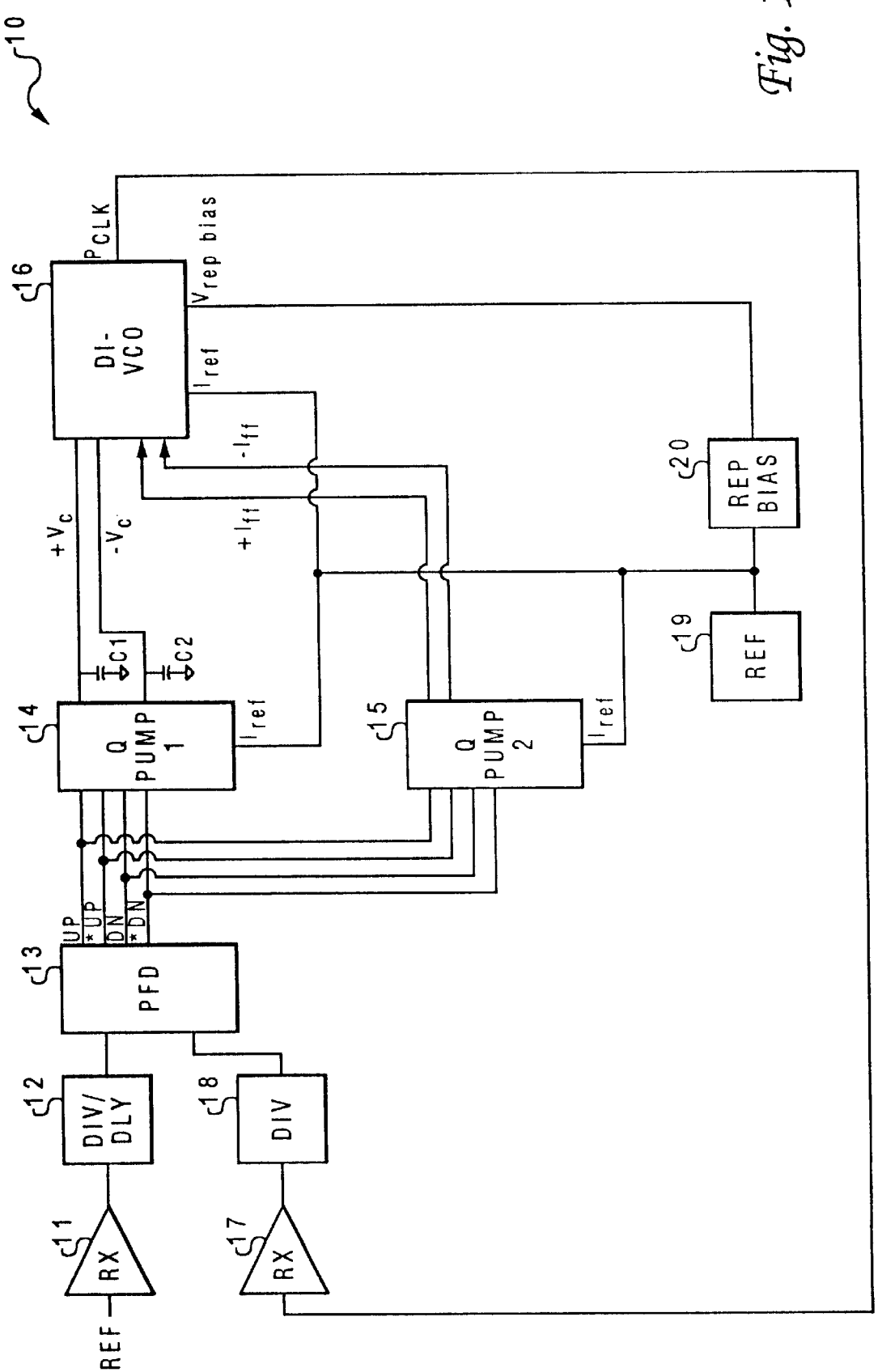
FIG. 1 is a block diagram of a phase-locked loop circuit in accordance with a preferred embodiment of the present invention.

Referring now to the drawings and in particular to FIG. 1, there is depicted a block diagram of a phase-locked loop (PLL) circuit in accordance with a preferred embodiment of the present invention. As shown, PLL circuit 10 includes receivers 11, 17, a delay 12, a divider 18, phase/frequency detector (PFD) 13, charge pumps 14, 15 and a delay-interpolating voltage-controlled oscillator (VCO) 16. PLL circuit 10 is capable of generating clock signals suitable for a processor operating at a frequency of 1 GHz or above.

The input to PLL circuit 10 is at the input of receiver 11 while the output of PLL circuit 10 is at the output of delay-interpolating VCO 16. Preferably, the input of receiver 11 is connected to an external reference clock REF while the output of delay-interpolating VCO 16 is connected to a clock input, $P_{clk}$, of a processor. If the reference clock REF received by receiver 11 is passed through a delay 12 that matches the delay of divider 18, then the frequency of the processor clock input $P_{clk}$ is related to the frequency of the external reference clock REF as follows: frequency of $P_{clk}$=function of divider 18 * frequency of REF. However, in a more general case, when the reference clock REF received by a receiver 11 is passed through a divider 12 rather than a delay, then the frequency of the processor clock input $P_{clk}$ is related to the frequency of the external reference clock REF as follows: frequency of $P_{clk}$=(function of divider 18 * frequency of REF) / function of divider 12.

The feedback clock $P_{clk}$ is connected to receiver 17 which has identical delay properties as receiver 11 for the reference clock REF so that the inputs of PFD 13 have the same phase relationships as reference clock REF and processor clock input $P_{clk}$.

PFD 13 is preferably a self-resetting complementary metal-oxide semiconductor (CMOS) design that has zero effective dead zone. PFD 13 creates four correction signals, namely, UP, DN, and their respective complements *UP and *DN, which are asserted according to the phase relationship of the inputs from dividers 12 and 18. All four correction signals (UP, DN, *UP, and *DN) of PFD 13 are connected to a first programmable charge pump 14 and a second programmable charge pump 15.

With the four correction signals, charge-pump 14 produces two complementary outputs. The two complementary outputs of charge-pump 14 are then integrated by filter capacitors C1 and C2 to produce a differential control voltage $\Delta V_c$, which has no damping factor. The differential control voltage $\Delta V_c$ is connected to the inputs of delay-interpolating VCO 16. During operation, when the UP correction signal is being asserted, C1 will be charged with a fixed amount of current while C2 will be discharged by the same amount of current. Contrarily, when the DN correction signal is being asserted, C2 will be charged with a fixed amount of current while C1 will be discharged by the same amount of current.

In the meantime, with the four correction signals, charge-pump 15 produces control currents $+I_{FF}$ and $-I_{FF}$, which are not filtered. Control currents $+I_{FF}$ and $-I_{FF}$ are injected directly into a second input pair of delay-interpolating VCO 16 in a feedforward fashion. Both charge-pumps 14 and 15 output precise currents that are generated by current mirrors from a reference current $I_{ref}$ from a reference circuit 19. Both charge-pumps 14 and 15 are preferably programmable so that optimal loop dynamics may be achieved across a wide range of applications.

Reference circuit 19 is connected to a replica biasing circuit 20. Replica biasing circuit 20 is preferably utilized to compensate for variations within delay-interpolating VCO 16 due to process, temperature, and power supply variations.

As mentioned above, the output of delay-interpolating VCO 16 is connected to a processor clock input, $P_{clk}$. The output of delay-interpolating VCO 16 is also connected to phase/frequency detector 13 via receiver 17 and divider 18, as the feedback path.

Figure 2:
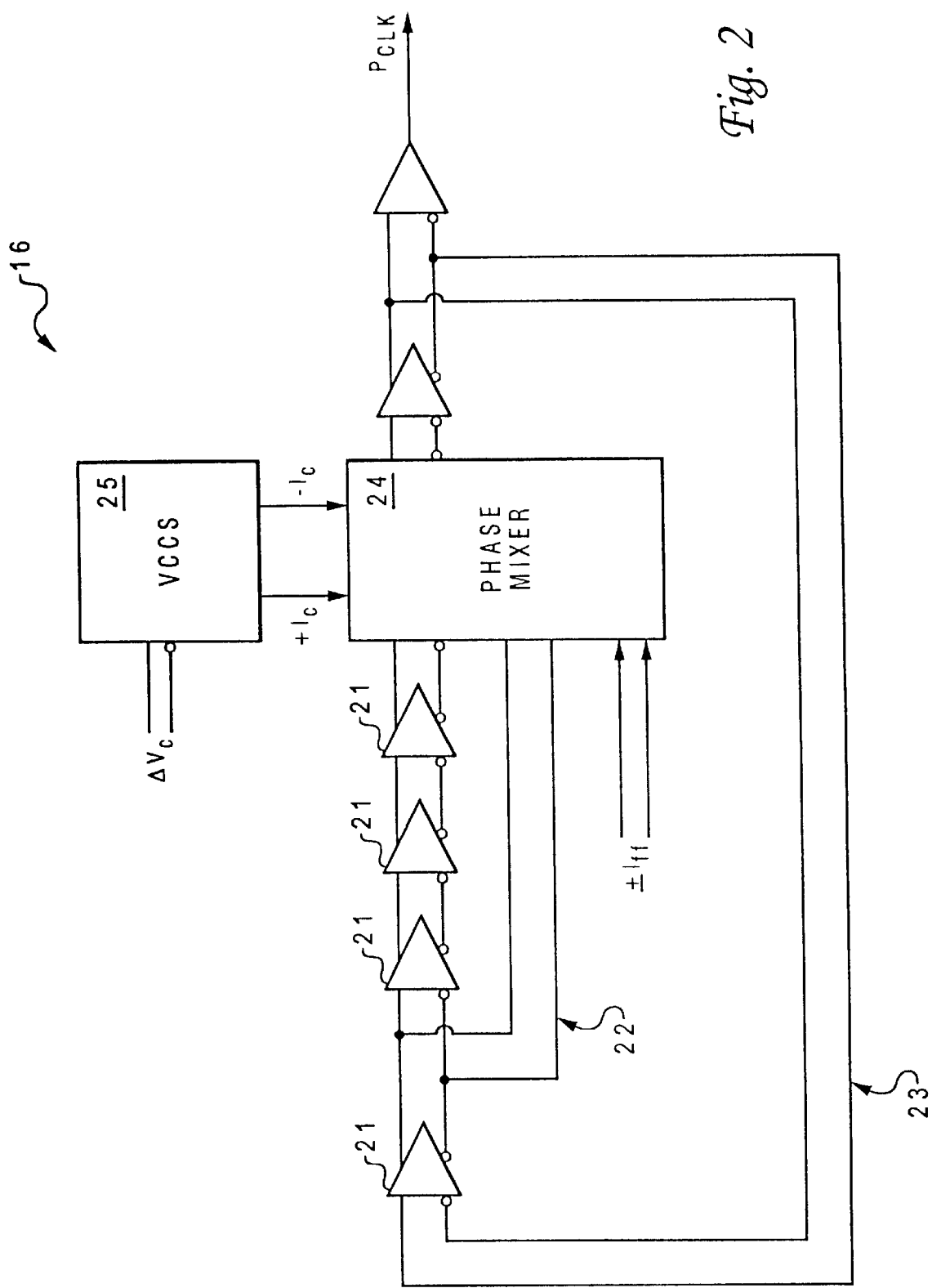
FIG. 2 is a detailed circuit diagram of a delay-interpolating VCO from FIG. 1, in accordance with a preferred embodiment of the present invention.

Referring now to FIG. 2, there is depicted a detailed block diagram of delay-interpolating VCO 16 from FIG. 1, in accordance with a preferred embodiment of the present invention. As shown, delay-interpolating VCO 16 includes a voltage-controlled current source 25 coupled to a phase mixer 24 having a ring of delay elements 21. The ring of delay elements 21 is constructed in a manner that a minor loop 22 and a major loop 23 are combined by phase mixer 24. Minor loop 22 consists of K delay elements while major loop 23 consists of L delay elements, wherein K is preferably less than L. As such, a continuous frequency verses voltage characteristic can be achieved, with frequency asymptotes defined by frequencies of minor loop 22 and major ring 23.

Voltage-controlled current source 25 generates currents $+I_c$ and $-I_c$. Currents $+I_c$ and $-I_c$ are proportional to a differential voltage $\Delta V_c$ (i.e., $(+V_c)-(-V_c)$), and are insensitive to the common-mode voltage $V_{com\ mod}$ (i.e., $(+V_c)+(-V_c)$). One approach to handling a high $V_{com\ mod}$ would be to provide more sophisticated input stages which can effectively eliminate common mode sensitivity. The resulting bandwidth reduction on the control input would, however, render the VCO practically useless due to the loss of the required high frequency signal caused by the zero frequency in the transfer function.

The average frequency of delay-interpolating VCO 16 is equal to $K_0 * \Delta V_c$, where $K_0$ is the gain of delay-interpolating VCO 16 in Hertz/Volt. The frequency of delay-interpolating VCO 16 is dithered by an amount of $\Delta I_{FF} * K_j$, where $K_j$ is the delay-interpolating VCO feedforward gain in Hertz/Ampere and $\Delta I_{FF}=(+I_{FF})-(-I_{FF})$ is the differential feedforward current. The dithered frequency is produced by directly injecting current from charge-pump 15 into phase mixer 24. As such, the dithered frequency does not suffer from the traditional bandwidth limiting effects of other approaches.

Figure 3:
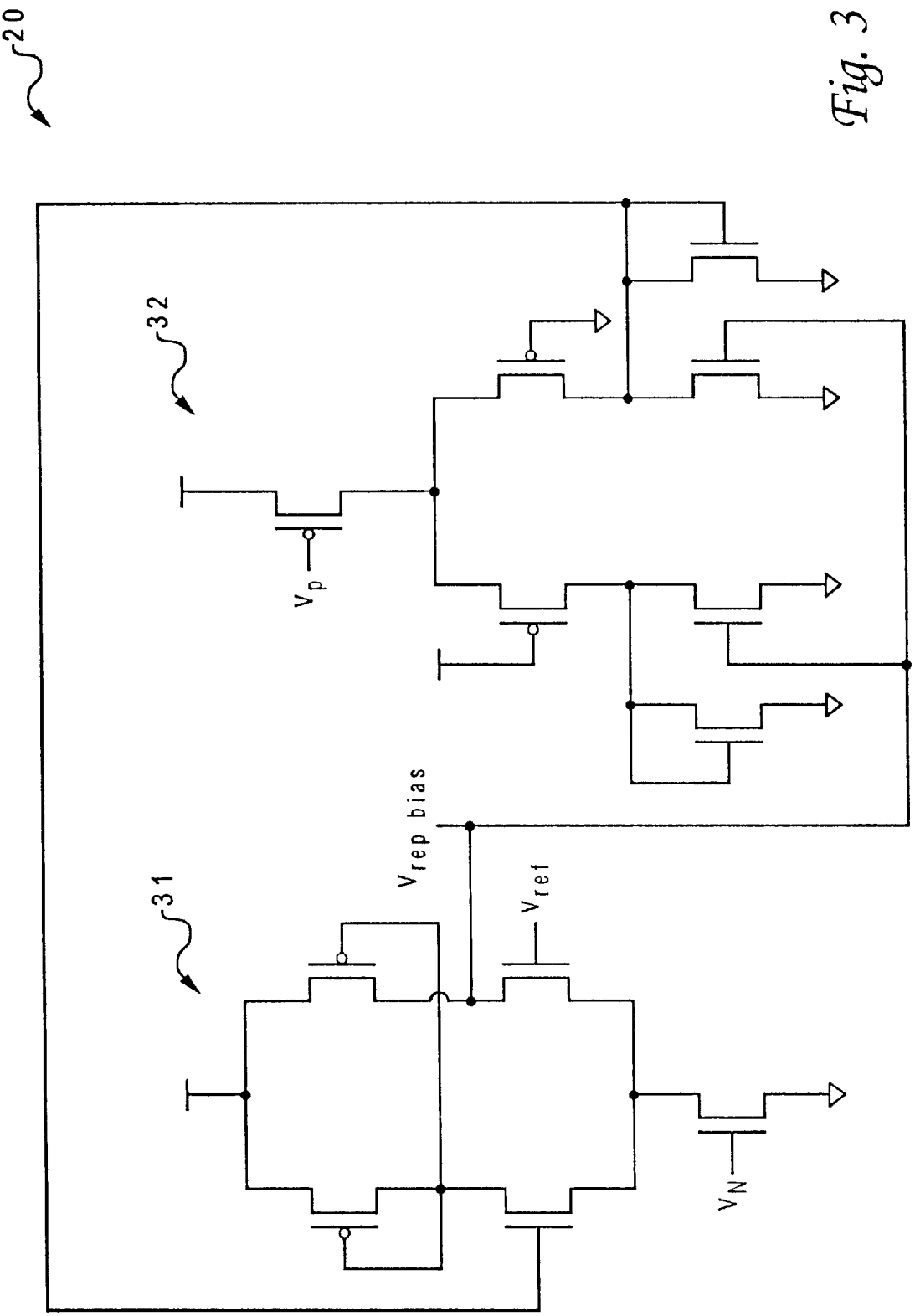
FIG. 3 is a circuit diagram of a replica biasing circuit from FIG. 1, in accordance with a preferred embodiment of the present invention.

Referring now to FIG. 3, there is illustrated a circuit diagram of replica biasing circuit 20 from FIG. 1, in accordance with a preferred embodiment of the present invention. As shown, a gain cell 31 is connected to a replica of a delay element 32 within delay-interpolating VCO 16 in a negative feedback arrangement to provide replica bias control voltage $V_{rep\ bias}$. All of the tail current of the replica stage is forced through one side of the differential pair, creating a voltage which represents the maximum DC voltage swing in the delay element for a given value of $V_{rep\ bias}$. This feedback voltage is compared to a voltage $V_{ref}$ by the gain cell. The voltage $V_{rep\ bias}$, which is utilized to bias the VCO active loads, is adjusted to minimize the difference between the feedback voltage and $V_{ref}$. As process or environment causes drift from the nominal design point, $V_{rep\ bias}$ is adjusted by the replica bias circuit to maintain constant swing.

Figure 4:
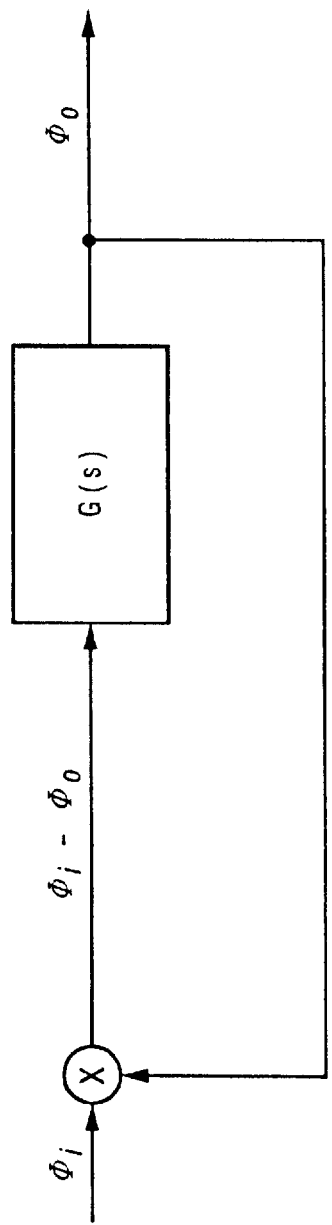
FIG. 4 is a block diagram illustrating the transfer function of a phase-locked loop circuit in accordance with a preferred embodiment of the present invention.

The following equations demonstrate the basic relationship governing the operations of PLL circuit 10, in accordance with a preferred embodiment of the present invention. Utilizing the convention adopted by Floyd M. Gardner in "Phaselock Techniques," $2^{nd}$ edition, Wiley-Interscience Publications (see FIG. 4), the average error current over a cycle is $$i_d = \frac{I_p t_p}{T_i} = \frac{I_p \theta_e / \omega_i}{2\pi/\omega_i} = \frac{I_p \theta_e}{2\pi} \tag{1}$$

where $I_p$ is the peak charge-pump current, $t_p$ is the ON time of the phase/frequency detector output, $T_i$ is the input period, and $\omega_i$ is the frequency in radian/sec, and $$\theta_e = |\theta_i - \theta_o| \quad (2)$$

is the magnitude of the phase error between the input and output.

Charge pump 14 with a loop filter impedence $$Z(s) = R + \frac{1}{sC} \quad (3)$$

produces an oscillator control voltage given by $$V_c(s) = I_d(s)Z(s) = \left( \frac{I_p \theta_e(s)}{2\pi} R + \frac{I_p \theta_e(s)}{2\pi Cs} \right) \quad (4)$$

where $I_d(S)$ is the Laplace transform of $i_d(t)$. The first term is related to the instantaneous voltage step $$\Delta v_c = I_p R \quad (5)$$

on the loop filter, while the second term is related to the average value of the loop filter voltage.

Charge pump 15 produces a feedforward current $I_f$, which directly modulates the delay-interpolating VCO. Although no resistor is utilized in this embodiment, it is useful to consider an equivalent resistance $R_{eq}$ for comparison to the conventional second-order loop equations. For the conventional case, there is $$\Delta f = \Delta v_c K_o = I_p R K_o \quad (6)$$

where $K_o$ represents the gain of the delay-interpolating VCO at the control input in Hertz/Volt and $\Delta f$ is the instantaneous frequency change. In a feedforward case, the frequency excursions depend only on the feedforward current and the gain of the delay-interpolating VCO in Hertz/Ampere taken at the feedforward port, which can be denoted as $K_j$:

$$\Delta f = K_j I_f \quad (7)$$

Combining equations (6) and (7) gives an expression for the equivalent loop filter resistance for the feedforward PLL $$R_{eq} = \frac{K_j I_f}{K_0 I_p} \quad (8)$$

By substitution $$V_c(s) = \frac{\theta_e(s)}{2\pi} \left( \frac{I_p}{sC} + \frac{I_f K_j}{K_0} \right) \quad (9)$$

and since $$\theta_0(s) = \frac{K_0 V_c(s)}{s} \quad (10)$$

hence $$G(s) = \frac{\theta_0(s)}{\theta_e(s)} = \frac{\frac{K_j I_f}{2\pi} \left( s + \frac{K_0 I_f}{K_j I_f C} \right)}{s^2} = K \frac{s + \omega_2}{s^2} \quad (11)$$

where $$K = \frac{K_j I_f}{2\pi} = \frac{K_0 I_p R_{eq}}{2\pi} \quad (12)$$

and $$\omega_2 = \frac{K_0 I_p}{K_j I_f C} = \frac{1}{r_{eq} C} = \frac{1}{\tau_2} \quad (13)$$

The transfer function and error function for PLL circuit 10 are $$H(s) = \frac{\theta_0(s)}{\theta_i(s)} = \frac{G(s)}{1 + G(s)} = \frac{K(s + \omega_2)}{s^2 + Ks + K\omega_2} = \frac{2\zeta\omega_n s + \omega_n^2}{s^2 + 2\zeta\omega_n s + \omega_n^2} \quad (14)$$

and $$1 - H(s) = \frac{\theta_e(s)}{\theta_i(s)} = \frac{s^2}{s^2 + Ks + K\omega_2} \quad (15)$$

respectively, and $$\omega_n = \sqrt{K\omega_2} = \sqrt{\frac{K_0 I_p}{2\pi C}} \quad (16)$$

$$\zeta = \frac{K}{2\omega_n} = \frac{K_j I_f}{2K_0 I_p} C \sqrt{\frac{K_0 I_p}{2\pi C}} = \frac{\tau_2}{2} \sqrt{\frac{K_0 I_p}{2\pi C}} \quad (17)$$

These results are similar to the well-known loop equations, but utilize $R_{eq}$ instead of R.

In summary, the open-loop transfer function of PLL circuit 10 is given by equation (11) and the closed-loop transfer function of PLL circuit 10 is given by equation (14).

As has been described, the present invention provides an improved phase-locked loop circuit for providing an external clock signal to a processor. This phase-locked loop circuit has been experimentally verified to operate at frequencies of up to 1.360 GHz and a jitter of ±36 picosecond, with a processor actively executing instructions at 1.0 GHz.

It is understood by those skilled in the art that the phase-locked loop circuit may be incorporated within a processor. The processor may be a reduced instruction set computing (RISC) or a complex instruction set computing (CISC) processor. The processor may include fixed-point unit(s) and/or floating-point unit(s), memory caches, registers, and various logic control circuits.

While the invention has been particularly shown and described with reference to a preferred embodiment, it will be understood by those skilled in the art that various changes in form and detail may be made therein without departing from the spirit and scope of the invention.

What is claimed is:

1. A phase-locked loop circuit comprising:
   a phase/frequency detector for receiving an input reference signal, wherein said phase/frequency detector has a first output and a second output;
   a voltage-controlled oscillator with feedforward current input for generating an output clock signal, wherein said output clock signal is also utilized as a feedback signal for said phase/frequency detector; and
   a first charge-pump coupled between said phase/frequency detector and said voltage-controlled oscillator, wherein said first charge-pump receives said first and second outputs and generates two complementary control signals for said voltage-controlled oscillator.

2. The phase-locked loop circuit according to claim 1, wherein said circuit further includes a second charge-pump coupled between said phase/frequency detector and said voltage-control oscillator, wherein said second charge-pump receives said first and second outputs and generates a differential current feed-forward signal for said voltage-control oscillator.

3. The phase-locked loop circuit according to claim 1, wherein said two complementary control signals form a differential current control signal.

4. The phase-locked loop circuit according to claim 3, wherein said differential current control signal is integrated by a filter circuit to produce a differential voltage control signal.

5. The phase-locked loop circuit according to claim 4, wherein said filter circuit includes at least two capacitors.

6. The phase-locked loop circuit according to claim 1, wherein said circuit further includes a replica biasing circuit for providing a replica bias control voltage to said voltage-control oscillator.

7. A processor comprising:

a processing unit;

a memory cache coupled to said processing unit;

a phase-locked loop circuit for provide a clock signal to said processor, wherein said phase-locked loop further includes a phase/frequency detector for receiving an input reference signal, wherein said phase/frequency detector has a first differential output and a second differential output;

a voltage-controlled oscillator with feedforward current input for generating an output clock signal, wherein said output clock signal is also utilized as a feedback signal for said phase/frequency detector; and a first charge-pump coupled between said phase/frequency detector and said voltage-controlled oscillator, wherein said first charge-pump receives said first and second differential outputs and generates two complementary control signals for said voltage-controlled oscillator.

8. The phase-locked loop circuit according to claim 7, wherein said circuit further includes a second charge-pump coupled between said phase/frequency detector and said voltage-control oscillator, wherein said second charge-pump receives said first and second outputs and generates a differential current feed-forward signal for said voltage-control oscillator.

9. The phase-locked loop circuit according to claim 7, wherein said two complementary control signals form a differential current control signal.

10. The phase-locked loop circuit according to claim 9, wherein said differential current control signal is integrated by a filter circuit to produce a differential voltage control signal.

11. The phase-locked loop circuit according to claim 10, wherein said filter circuit includes at least two capacitors.

12. The phase-locked loop circuit according to claim 7, wherein said circuit further includes a replica biasing circuit for providing a replica bias control voltage to said voltage-control oscillator.

* * * * *